(12) United States Patent
Yu et al.

(10) Patent No.: US 11,588,036 B2
(45) Date of Patent: Feb. 21, 2023

(54) HIGH-EFFICIENCY PACKAGED CHIP STRUCTURE AND ELECTRONIC DEVICE INCLUDING THE SAME

(71) Applicant: Vanguard International Semiconductor Corporation, Hsinchu (TW)

(72) Inventors: Hsiu-Mei Yu, Hsinchu (TW); Cheng-Yi Hsieh, Hsinchu County (TW); Wei-Chan Chang, Taoyuan (TW); Chang-Sheng Lin, Miaoli County (TW); Chun-Yi Wu, Taichung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 24 days.

(21) Appl. No.: 17/095,710

(22) Filed: Nov. 11, 2020

(65) Prior Publication Data
US 2022/0149170 A1 May 12, 2022

(51) Int. Cl.
*H01L 29/423* (2006.01)
*H01L 23/14* (2006.01)
*H01L 27/088* (2006.01)
*H01L 23/488* (2006.01)
*H01L 29/417* (2006.01)
*H01L 23/532* (2006.01)

(52) U.S. Cl.
CPC ........ *H01L 29/42372* (2013.01); *H01L 23/14* (2013.01); *H01L 23/488* (2013.01); *H01L 23/53242* (2013.01); *H01L 27/088* (2013.01); *H01L 29/41725* (2013.01)

(58) Field of Classification Search
CPC ............. H01L 23/488; H01L 23/53242; H01L 29/41725; H01L 29/66431; H01L 29/66462; H01L 29/778–7789; H01L 29/122–127; H01L 29/15–158
See application file for complete search history.

(56) References Cited

U.S. PATENT DOCUMENTS

| | | | |
|---|---|---|---|
| 8,704,273 | B2 | 4/2014 | Okamoto |
| 8,772,832 | B2 | 7/2014 | Boutros |
| 10,224,401 | B2 | 3/2019 | Mishra |
| 2021/0082920 | A1* | 3/2021 | Nonaka ............. H01L 29/78648 |
| 2022/0122903 | A1* | 4/2022 | Yue ....................... H01L 29/401 |

FOREIGN PATENT DOCUMENTS

| TW | 201611111 A | 3/2016 |
|---|---|---|
| TW | 201944594 A | 11/2019 |
| TW | I703696 B | 9/2020 |

* cited by examiner

*Primary Examiner* — Laura M Menz
*Assistant Examiner* — Candice Chan
(74) *Attorney, Agent, or Firm* — Winston Hsu

(57) ABSTRACT

A chip structure includes a substrate, a bottom conductive layer, a semiconductor layer, an interlayer dielectric layer, at least one electrode, and at least one top electrode. The substrate includes in order a core layer and a composite material. The bottom conductive layer is disposed on the bottom surface of the core layer, the semiconductor layer is disposed on the substrate, and an interlayer dielectric layer is disposed on the semiconductor layer. The at least one electrode is disposed between the semiconductor layer and the interlayer dielectric layer, and the at least one top electrode is disposed on the interlayer dielectric layer and electrically coupled to the at least one electrode.

13 Claims, 9 Drawing Sheets

(a)

(b)

HIGH-EFFICIENCY PACKAGED CHIP STRUCTURE AND ELECTRONIC DEVICE INCLUDING THE SAME

BACKGROUND OF THE INVENTION

1. Field of the Invention

The present disclosure relates to a chip structure, in particular to a high-efficiency packaged chip structure and an electronic device including the same.

2. Description of the Prior Art

With the development of the 5G communication and electric vehicle industries, the demand for high-frequency, high-power semiconductor devices is also growing. These high-frequency, high-power semiconductor devices include, for example, high-frequency transistors, high-power field-effect transistors, or high electron mobility transistors (HEMT). High-frequency, high-power semiconductor devices generally use compound semiconductors, such as gallium nitride (GaN), silicon carbide (SiC) or other III-V compound semiconductors, and the electrical properties of these semiconductor devices include high operating frequency, high breakdown voltage, and low on-resistance. In general, high-frequency and high-power semiconductor devices may be bonded on printed circuit boards by a chip-on-board (COB) approach. For example, a high-power semiconductor device may be bonded on a printed circuit board by performing the following steps: coating a polymer adhesive on a specific area of the printed circuit board, placing the high-power semiconductor device on the polymer adhesive, and then curing the polymer adhesive. In addition, other surface-mount devices (SMD) may also be disposed in other areas on the printed circuit board. With the vigorous development of the industry, how to provide chip structures and electronic devices including the chip structures which could be packaged efficiently is still the industry's goal.

SUMMARY OF THE INVENTION

A chip structure and an electronic device are provided according to embodiments of the present disclosure.

According to one embodiment of the present disclosure, a chip structure is provided and includes a substrate, a bottom conductive layer, a semiconductor layer, an interlayer dielectric layer, at least one electrode, and at least one top electrode. The substrate includes in order a core layer and a composite material. The bottom conductive layer is disposed on the bottom surface of the core layer, the semiconductor layer is disposed on the substrate, and an interlayer dielectric layer is disposed on the semiconductor layer. The at least one electrode is disposed between the semiconductor layer and the interlayer dielectric layer, and the at least one top electrode is disposed on the interlayer dielectric layer and electrically coupled to the at least one electrode.

According to another embodiment of the present disclosure, an electronic device is provided and includes a circuit board, a first package structure, a second package structure, a first solder, and a second solder. The circuit board includes conductive pads, and the first package structure is disposed on the circuit board. The first package structure includes a chip structure and a molding material covering the chip structure. The chip structure includes a substrate including a core layer and a composite material layer disposed in sequence. The chip structure further includes a bottom conductive layer disposed on the bottom surface of the core layer, and includes at least one electrode disposed on the substrate. The second package structure is disposed on the circuit board, and the second package structure includes a package body and a conductive structure. The first solder is disposed between the circuit board and the first package structure, where the first solder solders the bottom conductive layer to a portion of the conductive pads. The second solder is disposed between the circuit board and the second package structure, where the second solder may solder the conductive structure to another portion of the conductive pads.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
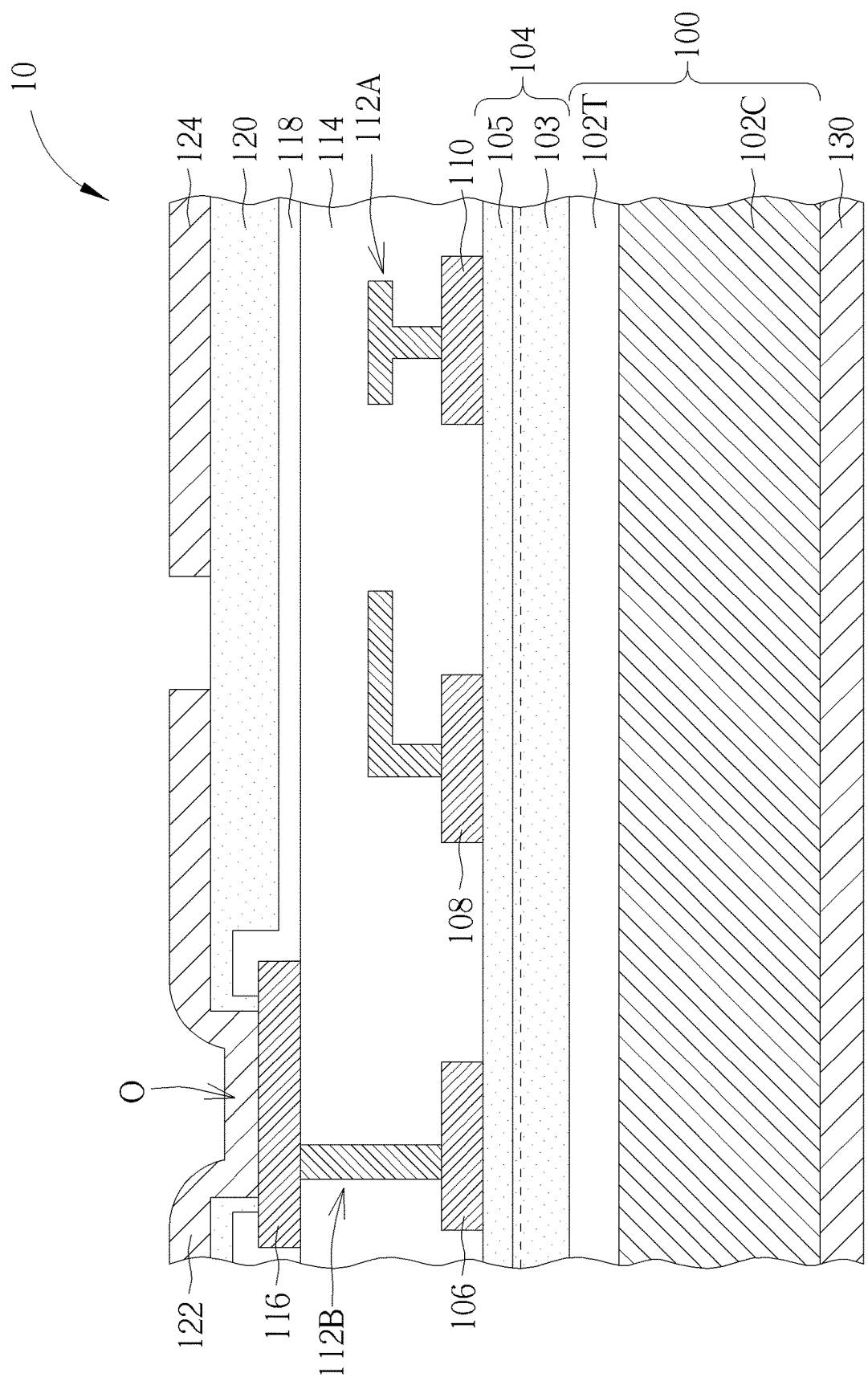
FIG. 1 is a schematic cross-sectional view of a chip structure according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that may vary as desired.

The terms, such as "coupled to" and "electrically coupled to", disclosed herein encompass all means of directly and indirectly electrical connection. For example, when an element or layer is referred to as being "coupled to" or "electrically coupled to" another element or layer, it may be directly coupled or electrically coupled to the other element or layer, or intervening elements or layers may be presented.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, GaInP, AlGaAs, InAlAs, InGaAs, or the like, or the combination thereof.

Besides, based on different requirements, group III-V semiconductor may contain dopants to become semiconductor with specific conductivity type, such as N-type or p-type.

It is understood that the specific order or hierarchy of blocks in the following disclosed processes/flowcharts is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the presented specific order or hierarchy.

Although the disclosure is described with respect to specific embodiments, the principles of the invention, as defined by the claims appended herein, may obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

FIG. 1 is a schematic cross-sectional view of a chip structure according to one embodiment of the present disclosure. Referring to FIG. 1, the chip structure 10 may include a substrate 100, a bottom conductive layer 130, a semiconductor layer 104, an interlayer dielectric layer 114, at least one electrode (such as a source electrode 106, a gate electrode 108, and a drain electrode 110), and at least one top electrode (such as a first top electrode 116).

According to one embodiment of the present disclosure, the substrate 100 may include a core layer 102C and a composite material layer 102T. The composition of the core layer 102C may be a ceramic substrate of silicon carbide (SiC), aluminum oxide ($Al_2O_3$), sapphire, aluminum nitride or a combination thereof. The composite material layer 102T may be disposed along the surface of core layer 102C and may include an insulating layer and a semiconductor bonding layer. According to one embodiment of the present disclosure, the composite material layer 102T may include a first insulating layer, a bonding layer (also called a seed layer), and a second insulating layer sequentially stacked along a direction away from the core layer 102C. The first insulating layer and the second insulating layer may be single or multilayer insulating material layers, such as oxide, nitride, oxynitride, or other suitable insulating materials, and the bonding layer (or the seed layer) may be semiconductor material, such as silicon, but not limited thereto. In a case where the core layer 102C is a ceramic substrate, its mechanical strength is higher than that of a single crystal silicon substrate, so the core layer 102C would not be cracked or bent easily.

The bottom conductive layer 130 may be disposed on the bottom surface of the core layer 102C, for example, along the bottom surface of the core layer 102C, and the bottom conductive layer 130 may cover at least 60%, for example, 60%-95% of the bottom surface area of the core layer 102C. According to a preferred embodiment, the bottom conductive layer 130 may cover 100% of the bottom surface of the core layer 102C. According to one embodiment of the present disclosure, the bottom conductive layer 130 may be a single layer structure or a composite structure. For example, the composition of the single-layer structure may include Au, Ag, or Cu, and the multi-layer structure may be selected from the group consisting of Ti/Ni/Au, Ti/Cu, Ti/Au, Cu/Ni/Au, Ni/Pd/Au, Ni/Au, Au/As, Al/Ni/Ag, and a combination thereof. Preferably, the bottom conductive layer 130 is a conductive material whose surface could be easily wetted by liquid or molten solder, for example, at least 80% of the surface of the bottom conductive layer 130 may be wetted by liquid or molten solder.

The semiconductor layer 104 is disposed on the substrate 100. According to one embodiment of the present disclosure, the semiconductor layer 104 may be a single semiconductor layer or a semiconductor stack. In case that the semiconductor layer 104 is a semiconductor stack, the semiconductor layer 104 may include semiconductor sub-layers stacked on each other. For example, semiconductor sub-layers may be III-V semiconductor sub-layers, and composition of each III-V semiconductor sub-layer may include gallium nitride (GaN), indium phosphide (InP), aluminum arsenide (AlAs), gallium arsenide (GaAs), aluminum gallium nitride (AlGaN), indium aluminum gallium nitride (InAlGaN) or indium gallium nitride (InGaN), aluminum nitride (AlN), gallium indium phosphide (GaInP), aluminum gallium arsenide (AlGaAs), indium aluminum arsenide (InAlAs), indium gallium arsenide (InGaAs), but not limited thereto. According to one embodiment of the present disclosure, when a high electron mobility transistor is provided in the chip structure 10, the semiconductor layer 104 may at least include a channel layer 103 and a barrier layer 105 stacked from bottom to top, or further include layers disposed below the channel layer 103, such as a nitride layer, a super lattice layer, and a high resistance layer, but not limited thereto. The nitride layer may be optionally disposed on the substrate 100 which has fewer lattice defects, so that the epitaxial quality of the semiconductor sub-layers disposed on the nitride layer may be improved. The superlattice layer may be used to reduce the degree of lattice mismatch between the substrate 100 and the semiconductor sub-layers disposed on the superlattice layer as well as reduce the stress caused by the lattice mismatch. Compared with other layers, the high resistance layer has higher resistivity, so leakage current between the semiconductor layers disposed on the high resistance layer and the substrate 100 may be avoided. The channel layer 103 may include one or more III-V semiconductor layers, and the compositions of the III-V semiconductor layers may be GaN, AlGaN, InGaN or InAlGaN, but not limited thereto. The barrier layer 105 may include one or more III-V semiconductor layers, and its composition may be different from that of the III-V semiconductor of the III-V channel layer. In addition, according to one embodiment of the present disclosure, the channel layer 103 may include a carrier channel region, such as a two-dimensional electron gas (2-DEG) region (indicated by a dotted line) adjacent to the upper surface of the channel layer 103. In addition, according to one embodiment of the present disclosure, the semiconductor layer 104 is electrically insulated from the bottom conductive layer 130.

The interlayer dielectric layer 114 may be disposed on the semiconductor layer 104 and cover at least one electrode, such as the source electrode 106, the gate electrode 108, and the drain electrode 110. According to one embodiment of the present disclosure, electronic signals or currents may be transmitted between the source electrode 106 and the drain electrode 110, and varying gate voltages may be applied to the gate electrode 108 to control the magnitude of the electronic signals or currents flowing in the semiconductor layer 104 below the gate electrode 108. Interconnection structure 112A and 112B may be disposed in the interlayer dielectric layer 114, where the interconnection structure 112A may be electrically coupled to the gate electrode 108 and the drain electrode 110, and the interconnection structure 112B may be electrically coupled to the source electrode 106, but not limited thereto.

At least one top electrode, such as a first top electrode 116, a second top electrode (not shown), and a third top electrode (not shown), may be disposed on the interlayer dielectric layer 114. The top electrodes may be separated from each other and may be electrically coupled to the underlying source electrode 106, gate electrode 108, and drain electrode 110 through interconnection structures 112A and 112B, respectively.

The chip structure 10 may further include an optional passivation layer 118, an insulating polymer layer 120, and at least one bonding pad (for example, a first bonding pad 122, a second bonding pad 124, and a third bonding pad (not shown)). The insulating polymer layer 120 is, for example, a photoresist, such as polyimide or polymerized benzocyclobutene (BCB), but not limited thereto. The insulating polymer layer 120 may be disposed on the interlayer dielectric layer 114, and the corresponding top electrode may be exposed from an opening in the insulating polymer layer 120, for example, the first top electrode 116 may be exposed from the opening O. The optional passivation layer 118 may be disposed between the insulating polymer layer 120 and the first top electrode 116 and other top electrodes, so that some regions of the first top electrode 116 and some regions of other top electrodes may overlap the passivation layer 118. Passivation layer 118 may be silicon nitride, but not limited thereto. At least one bonding pad may be disposed on the insulating polymer layer 120 and electrically coupled to at least one top electrode. For example, the first bonding pad 122 of the at least one bonding pad may be electrically coupled to the first top electrode 116 of the at least one top electrode and further electrically coupled to the underlying source electrode 106. In addition, according to one embodiment of the present disclosure, the at least one bonding pad (e.g., the first bonding pad 122) may directly contact the insulating polymer layer 120 and the at least one top electrode (e.g., the first top electrode 116). According to one embodiment of the present disclosure, the at least one bonding pad may be a single-layer structure or a composite structure. For example, the composition of the single-layer structure may include Au, Ag, or Cu, while the multi-layer structure may be selected from the group consisting of Ti/Ni/Au, Ti/Cu, Ti/Au, Cu/Ni/Au, Ni/Pd/Au, Ni/Au, Au/As, Al/Ni/Ag and a combination thereof.

Figure 2:
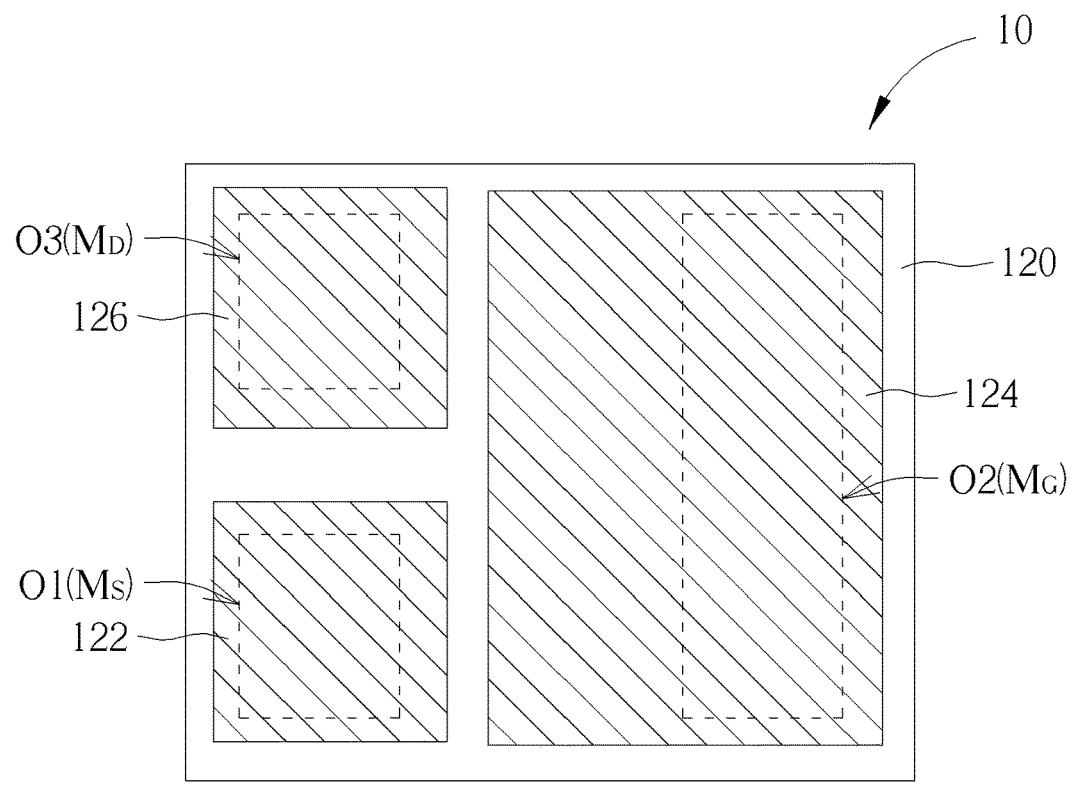
FIG. 2 is a schematic top view of a chip structure according to one embodiment of the present disclosure.
Figure 2:
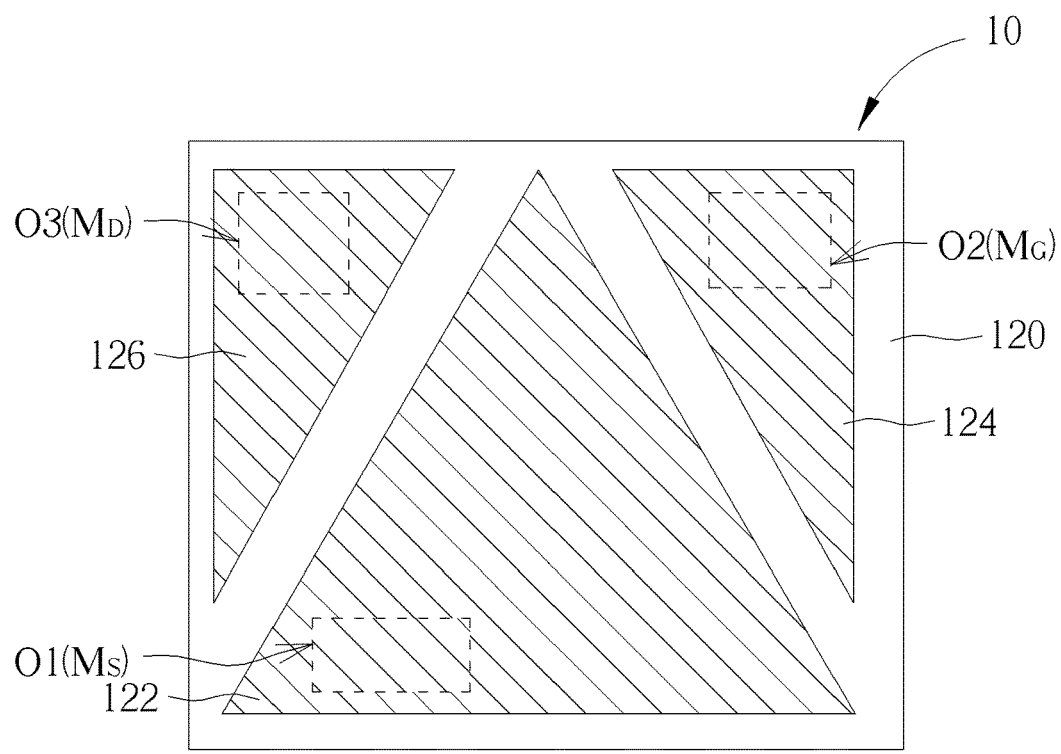

FIG. 2 is a schematic top view of a chip structure according to one embodiment of the present disclosure. Referring to FIG. 2, the chip structure 10 may be regarded as a top view structure corresponding to the cross-sectional structure of FIG. 1. The first bonding pad 122, the second bonding pad 124 and the third bonding pad 126 may be disposed on the insulating polymer layer 120 and directly contact the top electrodes $M_S$, $M_G$ and $M_D$ exposed from the openings O1, O2 and O3, respectively. As shown by the type (a) in FIG. 2, according to one embodiment of the present disclosure, the top-view area of each or at least one of the first bonding pad 122, the second bonding pad 124, and the third bonding pad 126 may be larger than the top-view area of the top electrodes $M_S$, $M_G$ and $M_D$ exposed from the openings O1, O2 and O3. In addition, the top-view contours of the first bonding pad 122, the second bonding pad 124, and the third bonding pad 126 may be rectangular, but not limited thereto. As shown by the type (b) in FIG. 2, the top-view contours of the first bonding pad 122, the second bonding pad 124, and the third bonding pad 126 are not rectangular but triangular, but not limited thereto. According to one embodiment of the present disclosure, the top-view contour of each of the first bonding pad 122, the second bonding pad 124, and the third bonding pad 126 may also be circular, annular, sector-shaped, arc-shaped, elliptical, or other suitable polygons.

Figure 3:
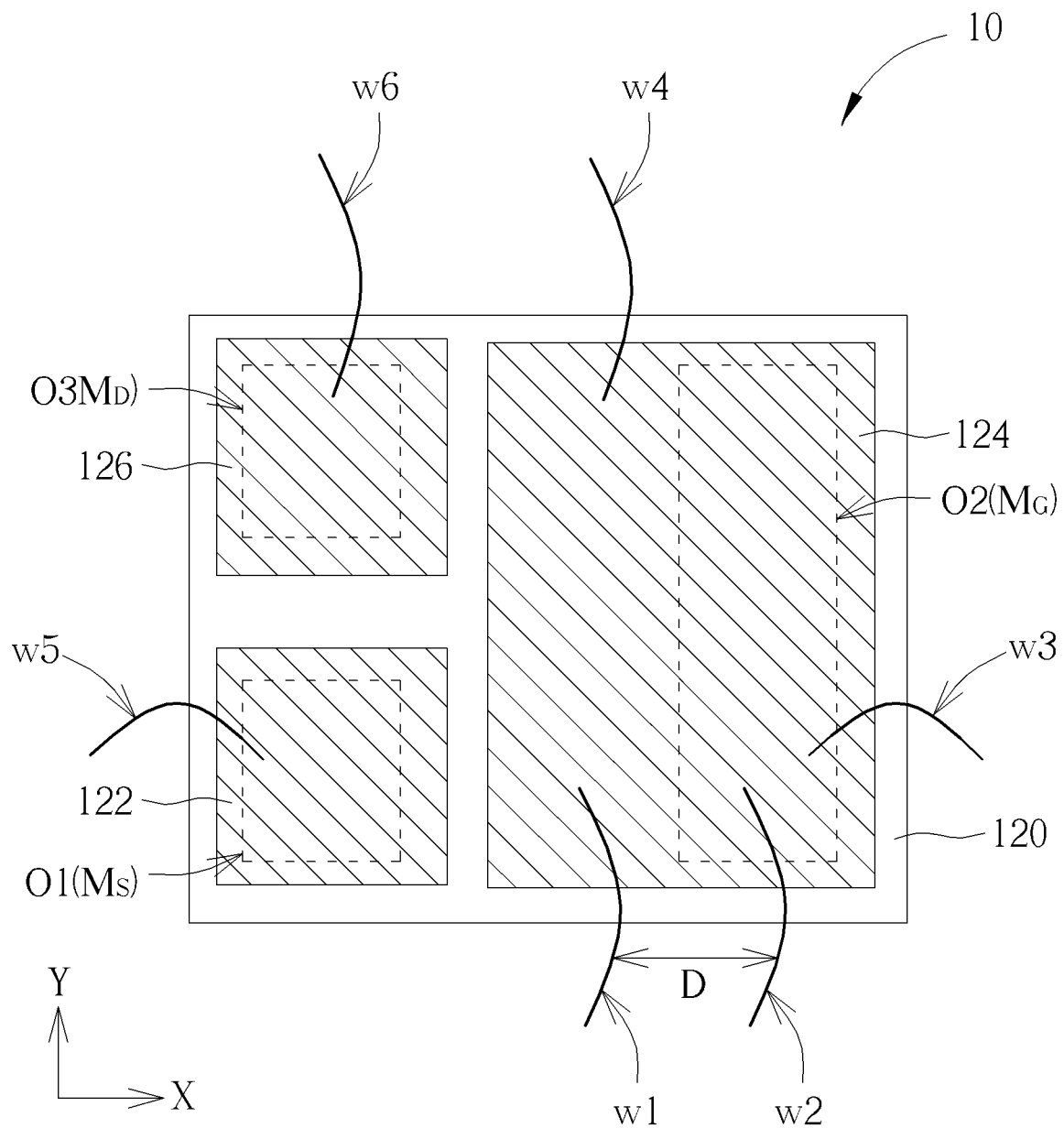
FIG. 3 is a schematic top view of the die structure according to one embodiment of the present disclosure after wire bonding.

FIG. 3 is a schematic top view of the chip structure according to one embodiment of the present disclosure after a wire bonding process. Referring to FIG. 3, the first bonding pad 122, the second bonding pad 124, and the third bonding pad 126 may cover at least 20% of the top surface area of the die structure 10, for example, 20%-95% of the top surface area, which is more favorable to the bonding process using bonding wires W1-W6. For example, the second bonding pad 124 itself may accommodate a plurality of bonding wires W1-W4, and the wire spacing D between the bonding wires W1 and W2 may be large enough, for example, ten times the wire diameter of the bonding wires, thus avoiding short-circuit contact between the bonding wires W1 and W2 and reducing on-resistance ($R_{on}$). In addition, the bonding wires W1-W6 are not limited to extend in the same direction, but some of which may extend in the x direction (such as the bonding wires W3, W5) or some of which may extend in the y direction (such as the bonding wires W1, W2, W4, W6). In addition, the first bonding pad 122, the second bonding pad 124, and the third bonding pad 126 may be used to accommodate not only the bonding wires W1-W6 but also additional bonding wires, bonding wires with larger wire diameter (>50 μm), or bonding ribbons.

In order to enable one of ordinary skill in the art to implement the present disclosure, a method of fabricating chip structures of the present disclosure is further described below.

Figure 4:
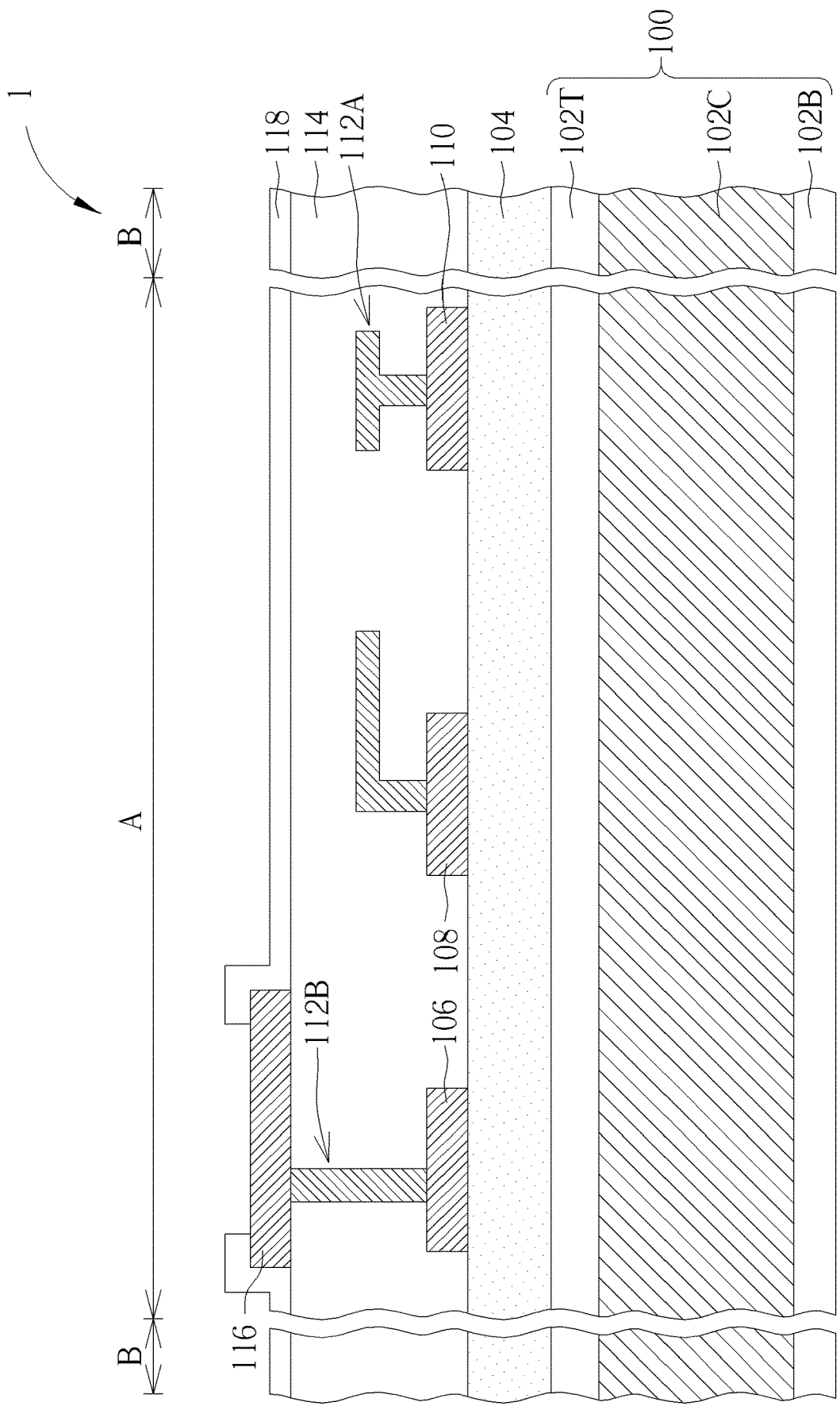
FIG. 4 is a schematic cross-sectional view of a wafer structure according to one embodiment of the present disclosure.

FIG. 4 is a schematic cross-sectional view of a wafer structure according to one embodiment of the present disclosure. Referring to FIG. 4, a wafer structure 1 may be formed. The wafer structure 1 may be an uncut wafer including a plurality of die regions A and a plurality of scribe line regions B. According to one embodiment of the present disclosure, the wafer structure 1 may include a substrate 100, a semiconductor layer 104, an interlayer dielectric layer 114, at least one electrode (e.g., a source electrode 106, a gate electrode 108, and a drain electrode 110), interconnect structures 112A and 112B, at least one top electrode (e.g., a first top electrode 116), and an optional passivation layer 118. According to one embodiment of the present disclosure, the substrate 100 may include a core layer 102C and composite layers 102B and 102T covering the core layer 102C. According to one embodiment of the present disclosure, at least one of the composite material layers 102B and 102T may include a first insulating layer, a semiconductor bonding layer, and a second insulating layer stacked in sequence in a direction away from the core layer 102C.

Figure 5:
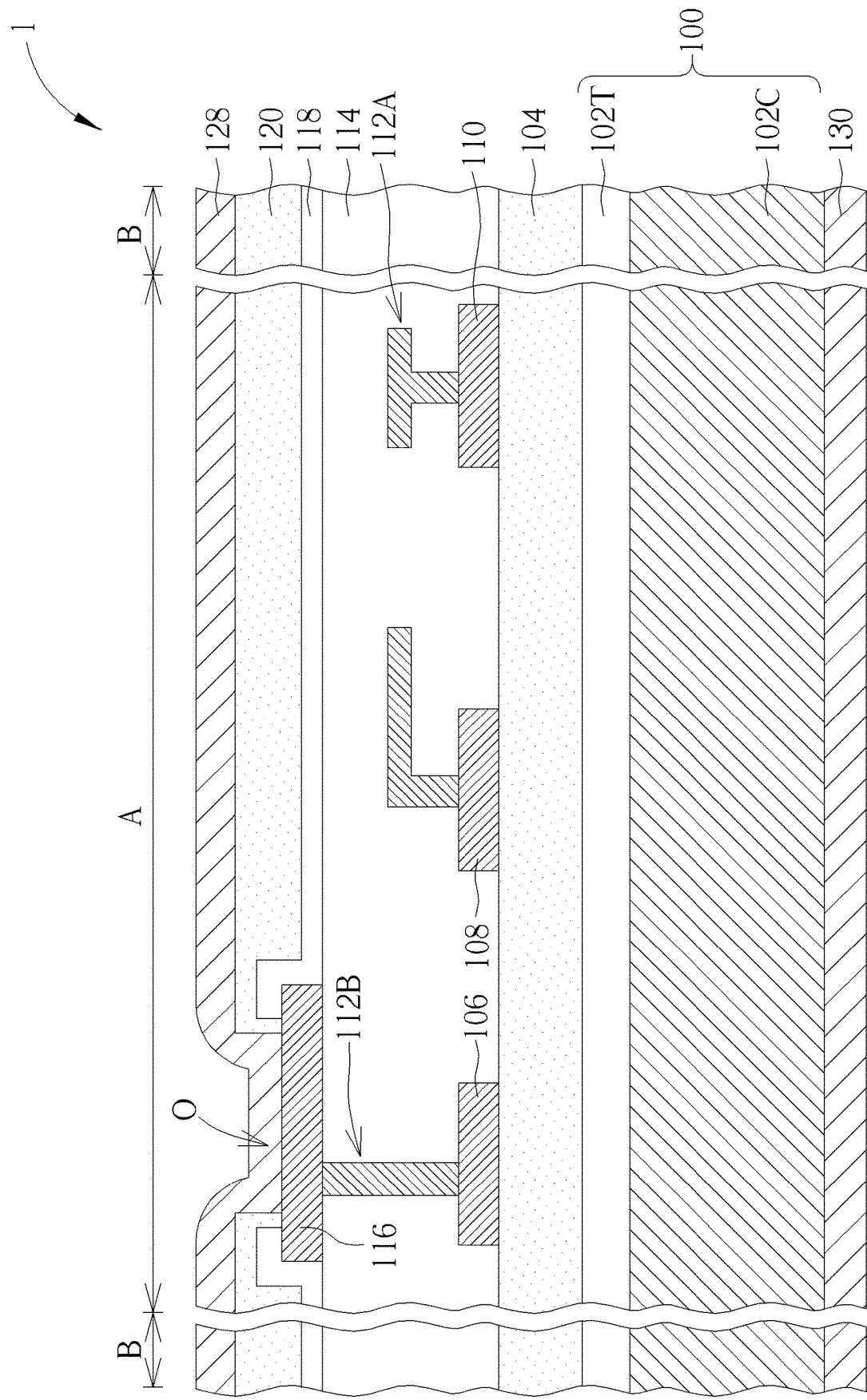
FIG. 5 is a schematic cross-sectional view of a wafer structure after forming an extending conductive layer according to one embodiment of the present disclosure.

FIG. 5 is a schematic cross-sectional view of a wafer structure after forming an extending conductive layer according to one embodiment of the present disclosure. Referring to FIG. 5, by performing appropriate photolithography and etching processes, a photosensitive insulating polymer layer 120 may be formed on the interlayer dielectric layer 114, and at least one opening O may be formed in the insulating polymer layer 120 to expose the corresponding underlying first top electrode 116 and other top electrodes. Thereafter, a conductive layer may be formed on the top surface of the insulating polymer layer 120 by performing a suitable deposition process, such as evaporation, sputtering or electroplating, thereby forming a bonding pad layer 128 in the die regions A and the scribe line regions B. Then, appropriate photoresist coating, photolithography and etching processes may be performed to pattern the bonding pad layer 128, thereby forming a plurality of bonding pads with specific top-view contours in each die region A. Thereafter, the substrate 100 of the wafer structure 1 may be thinned to completely remove the composite material layer 102B at the bottom of the substrate 100 as well as remove a portion of the core layer 102C. After the substrate 100 is thinned, a suitable deposition process, such as evaporation, sputtering or electroplating, may be performed on the bottom surface of the substrate 100 to form a conductive material on the bottom surface of the core layer 102C, thereby forming a bottom conductive layer 130 in the die regions A and the scribe line regions B. In addition, according to different requirements, the conductive layer may be patterned by photolithography and etching processes to thereby form a patterned bottom conductive layer 130.

Figure 6:
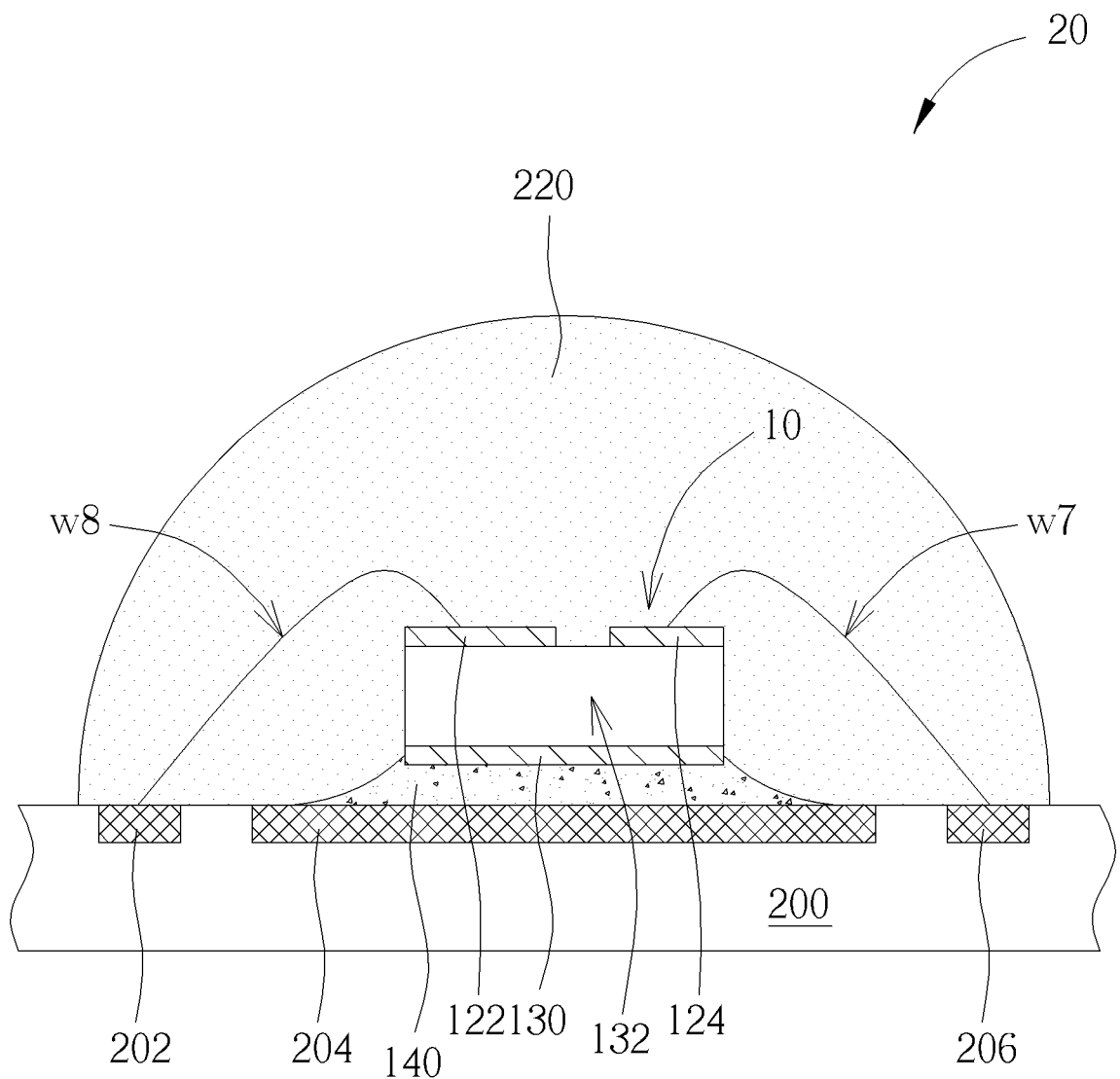
FIG. 6 is a schematic cross-sectional view of a first package structure according to one embodiment of the present disclosure.

FIG. 6 is a schematic cross-sectional view of a first package structure according to one embodiment of the present disclosure. Referring to FIG. 6, a first package structure 20 may include at least the die structure 10, a circuit board (such as a printed circuit board 200), and a molding material 220. The die structure 10 may include a device layer 132, first and second bonding pads 122 and 124 disposed on the device layer 132, and a bottom conductive layer 130 disposed under the device layer 132. The first bonding pad 122 and the second bonding pad 124 may be electrically coupled to the conductive pad 202 and the conductive pad 206 of the printed circuit board 200 by bonding wires W8 and W7, respectively. The bottom conductive layer 130 may be composed of conductive material whose surface may be easily wetted by liquid solder, so that the bottom conductive layer 130 may be bonded to the conductive pad 204 of the printed circuit board 200 by solder 140, such as tin-containing solder. The molding material 220 may be polymer resin, such as epoxy resin, which is used to encapsulate the die structure 10 and the bonding wires W7 and W8.

Figure 7:
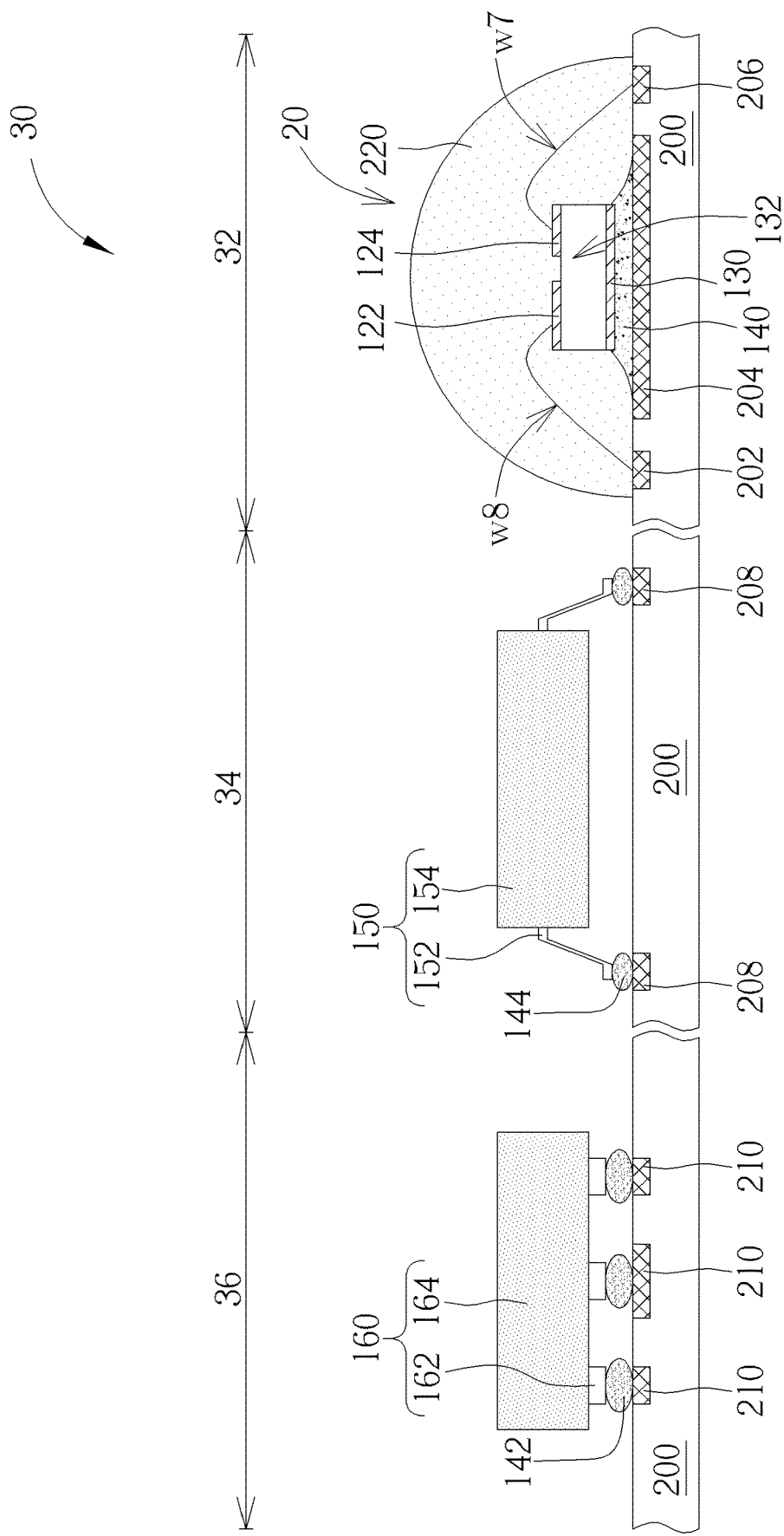
FIG. 7 is a schematic cross-sectional view of an electronic device according to one embodiment of the present disclosure.

FIG. 7 is a schematic cross-sectional view of an electronic device according to one embodiment of the present disclosure. Referring to FIG. 7, according to one embodiment of the present disclosure, the electronic device 30 may include at least a first region 32 and a second region 34 for accommodating the first package structure 20 and the second package structure 150, respectively. The second package structure 150 is a surface mount device including a package body 154 and a conductive structure (e.g., leads 152), such as a quad flat package (QFP). A semiconductor chip, such as a logic chip, may be disposed in the package body 154, and electronic signals may be transmitted between the semiconductor chip and the conductive pads 208 of the printed circuit board 200 through the leads 152. According to one embodiment of the present disclosure, solder 140 may be disposed between the bottom conductive layer 130 of the first package structure 20 and the conductive pads 204 of the printed circuit board 200, while solder 144 may be disposed between the leads 152 of the second package structure 150 and the conductive pads 208 of the printed circuit board 200. The solder 140 and the solder 144 may have the same composition, but not limited thereto. In a preferred embodiment, for the first package structure 20 in the first region 32, no conductive adhesive, such as silver adhesive, is disposed between the bottom conductive layer 130 and the conductive pad 204 of the first package structure 20.

According to one embodiment of the present disclosure, the electronic device 30 may further include a third region 36 for accommodating another second package structure 160. The second package structure 160 is a surface mount device including package body 164 and conductive structure (e.g., conductive bumps 162), such as quad flat no-lead package (QFN) or ball grid array package (BGA). A semiconductor chip may be disposed in the package 164, and electronic signals may be transmitted between the semiconductor chip and the conductive pads 210 of the printed circuit board 200 through the conductive bumps 162. According to one embodiment of the present disclosure, the solder 142 may be disposed between the conductive bumps 162 of the second package structure 160 and the conductive pads 210 of the printed circuit board 200. The solders 140, 142, and 144 may have the same composition, but not limited thereto.

In order to enable one of ordinary skill in the art to implement the present disclosure, a method of fabricating electronic devices of the present disclosure is further described below.

Figure 8:
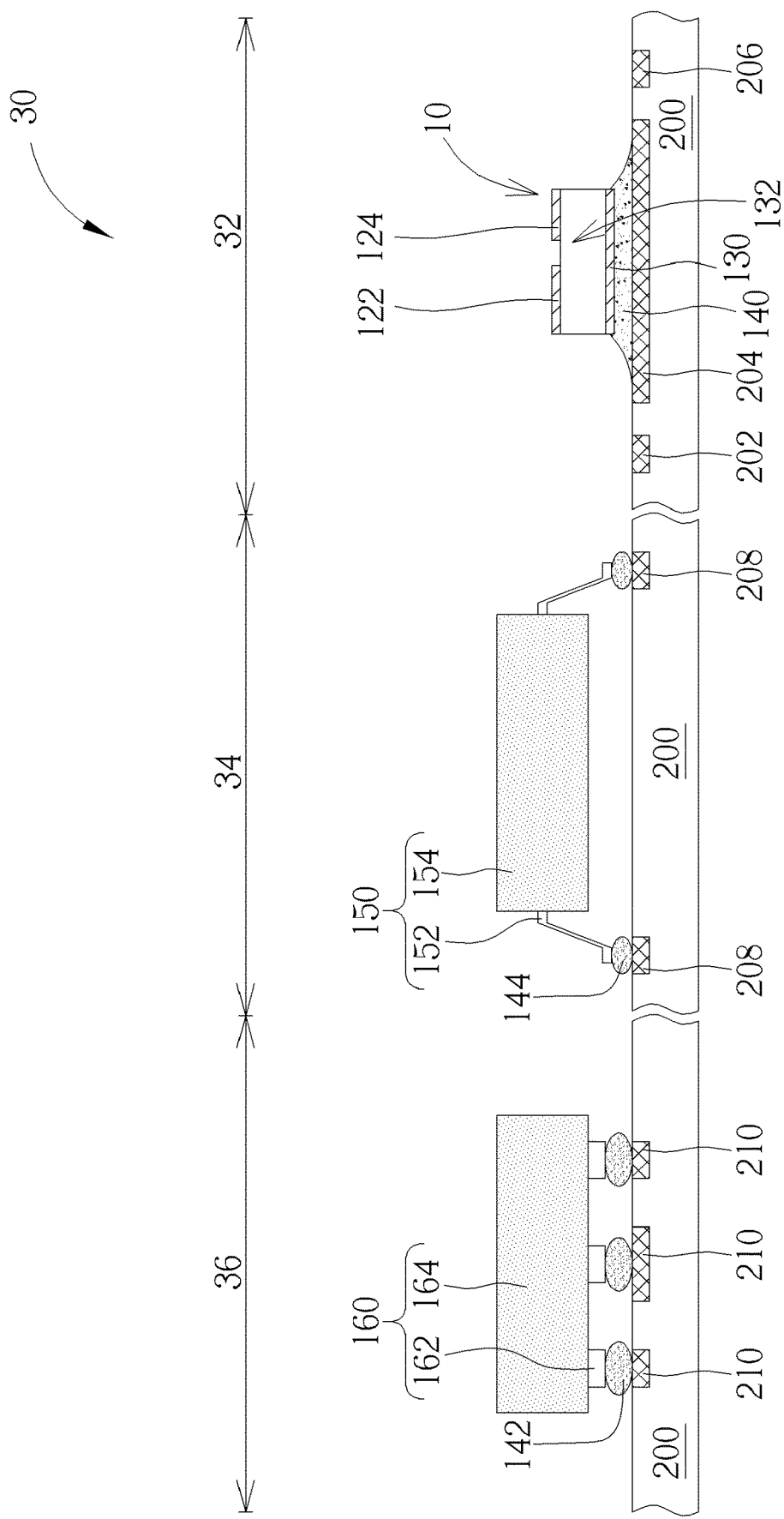
FIG. 8 is a schematic cross-sectional view of a circuit board with a first package and a second package thereon according to one embodiment of the present disclosure.
Figure 9:
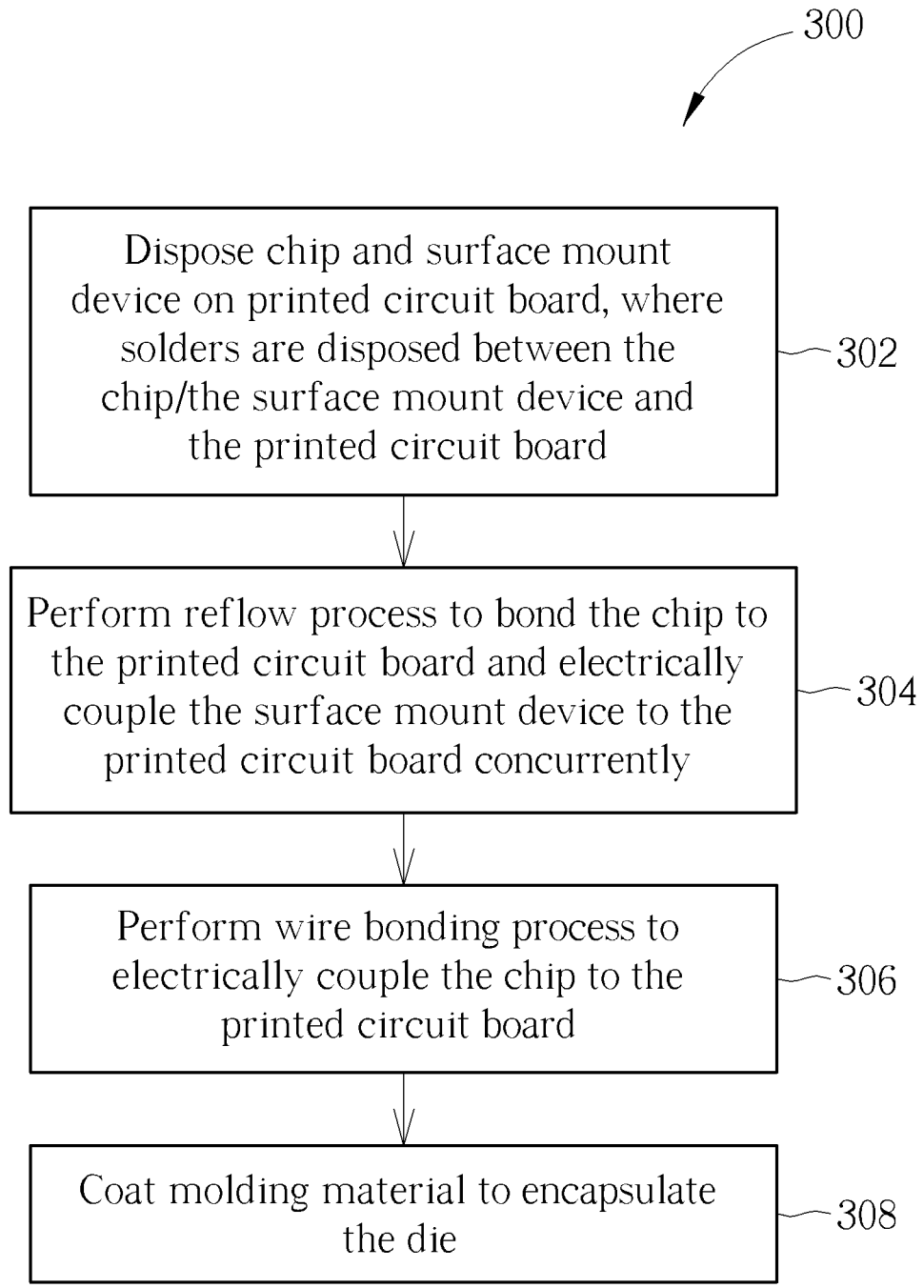
FIG. 9 is a flowchart illustrating a method of fabricating an electronic device according to one embodiment of the present disclosure.

FIG. 8 is a schematic cross-sectional view of a circuit board with a first package and a second package thereon according to one embodiment of the present disclosure. FIG. 9 is a flowchart illustrating a manufacturing method of an electronic device according to one embodiment of the present disclosure. First, in step 302 of the method 300, a die and a surface mount device are disposed on a printed circuit board, where a solder is disposed between the die/the surface mount device and the printed circuit board. For example, referring to FIG. 8, the die structure 10 and surface mount devices (e.g., second package structures 150 and 160) may be disposed on the printed circuit board 200, and the solders 140, 142 and 144 are disposed between the die structure 10/surface mount devices and the printed circuit board 200. Then, in step 304, a reflow process is performed to bond the die to the printed circuit board and electrically couple the surface mount device to the printed circuit board. For example, a reflow process may be performed to bond the die structure 10 to the conductive pads 204 of the printed circuit board 200 and concurrently electrically couple the surface mount devices (such as the second package structures 150 and 160) to the conductive pads 208 and 210 of the printed circuit board 200. By performing the reflow process, the die structure 10 and the second package structures 150 and 160 may be soldered to the printed circuit board 200.

Next, in step 306, a wire bonding process may be performed to electrically couple the die to the printed circuit board, for example, to electrically couple the die structure 10 to the conductive pads 202 and 206 of the printed circuit board 200. Then, in step 308, the molding material 220 is coated to encapsulate the die structure 10 to thereby form the structure shown in FIG. 7.

According to the above embodiments, by forming the conductive material, whose surface could be easily wetted by solder, at the bottom of the die structure, the die structure and other package structures may be bonded to the printed circuit board through the same reflow process, thus simplifying the process. In addition, the bonding pad with larger area is disposed on the top of the chip structure, which is also beneficial to the implementation of the wire bonding process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip structure, comprising:
   a substrate, comprising a core layer and a composite material layer disposed in sequence;
   a bottom conductive layer, disposed on a bottom surface of the core layer, wherein the bottom conductive layer is configured to be soldered to a circuit board through a solder;
   a semiconductor layer, disposed on the substrate;
   an interlayer dielectric layer, disposed on the semiconductor layer;
   at least one electrode, comprising a source electrode and disposed between the semiconductor layer and the interlayer dielectric layer, wherein the bottom conductive layer is electrically insulated from the source electrode; and
   at least one top electrode disposed on the interlayer dielectric layer and electrically coupled to the at least one electrode.

2. The chip structure of claim 1, wherein a composition of the core layer comprises aluminum nitride, silicon carbide, aluminum oxide, or a combination thereof.

3. The chip structure of claim 1, wherein the composite material layer comprises an insulating layer and a semiconductor bonding layer.

4. The chip structure of claim 1, wherein the bottom conductive layer is electrically insulated from the semiconductor layer.

5. The chip structure of claim 1, wherein the bottom conductive layer is a single-layer structure or a multi-layer structure, wherein a composition of the single-layer structure comprises Au, Ag or Cu, and the multi-layer structure is selected from the group consisting of Ti/Ni/Au, Ti/Cu, Ti/Au, Cu/Ni/Au, Ni/Pd/Au, Ni/Au, Au/As, and a combination thereof.

6. The chip structure of claim 1, wherein the interlayer dielectric layer has a flat top surface and the at least one top electrode is disposed on the flat top surface of the interlayer dielectric layer.

7. The chip structure of claim 1, further comprising:
   an insulating polymer layer, disposed on the interlayer dielectric layer, the insulating polymer layer comprising an opening, wherein a portion of the at least one top electrode is exposed from the opening; and
   at least one bonding pad, disposed on the insulating polymer layer and electrically coupled to the at least one top electrode, wherein an area of the at least one bonding pad is larger than an area of the portion of the at least one top electrode when the areas are viewed from a top down perspective.

8. The chip structure of claim 7, wherein the insulating polymer layer comprises at least one opening exposing the at least one top electrode.

9. The chip structure of claim 7, wherein the at least one bonding pad directly contacts the insulating polymer layer and the at least one top electrode.

10. The chip structure of claim 7, wherein the at least one bonding pad is a single-layer structure or a multi-layer structure, wherein the single-layer structure comprises Au, Ag or Cu, and the multi-layer structure is selected from the group consisting of Ti/Ni/Au, Ti/Cu, Ti/Au, Cu/Ni/Au, Ni/Pd/Au, Ni/Au, Au/As, Al/Ni/Ag and a combination thereof.

11. The chip structure of claim 7, wherein the at least one bonding pad and the bottom conductive layer comprise the same composition.

12. The chip structure of claim 7, wherein the at least one bonding pad is configured to be electrically coupled to a bonding wire by soldering.

13. The chip structure of claim 7, wherein,
the at least one electrode comprises a source electrode, a drain electrode, and a gate electrode;
the at least one top electrode comprises a first top electrode, a second top electrode, and a third top electrode; and
the at least one bonding pad comprises a first bonding pad, a second bonding pad and a third bonding pad,
wherein the first bonding pad is electrically coupled to the first top electrode and the source electrode, the second bonding pad is electrically coupled to the second top electrode and the gate electrode, and the third bonding pad is electrically coupled to the third top electrode and the drain electrode, and the first bonding pad at least partially overlaps the source electrode.

* * * * *